United States Patent
Stark

(10) Patent No.: US 9,443,690 B2
(45) Date of Patent: Sep. 13, 2016

(54) DEVICE FOR GENERATING MICROWAVES

(71) Applicant: DIEHL BGT DEFENCE GMBH & CO. KG, Ueberlingen (DE)

(72) Inventor: Robert Stark, Bad Windsheim (DE)

(73) Assignee: Diehl BGT Defence GmbH & Co. KG, Ueberlingen (DE)

( * ) Notice: Subject to any disclaimer, the term of this patent is extended or adjusted under 35 U.S.C. 154(b) by 165 days.

(21) Appl. No.: 14/222,817

(22) Filed: Mar. 24, 2014

(65) Prior Publication Data
US 2014/0285086 A1  Sep. 25, 2014

(30) Foreign Application Priority Data
Mar. 23, 2013 (DE) .................. 10 2013 005 095

(51) Int. Cl.
*H01J 23/213* (2006.01)
*F41H 13/00* (2006.01)
*H03B 11/02* (2006.01)

(52) U.S. Cl.
CPC ......... *H01J 23/213* (2013.01); *F41H 13/0068* (2013.01); *H03B 11/02* (2013.01)

(58) Field of Classification Search
None
See application file for complete search history.

(56) References Cited

U.S. PATENT DOCUMENTS

| | | | | |
|---|---|---|---|---|
| 6,581,581 B1 * | 6/2003 | Bebich | .................. | F02P 23/045 123/536 |
| 7,215,083 B2 | 5/2007 | Staines | | |
| 7,868,273 B2 | 1/2011 | Ganghofer | | |
| 2003/0076044 A1 * | 4/2003 | Staines | ............... | F41H 13/0068 315/39 |
| 2003/0128554 A1 * | 7/2003 | Crewson | ................ | H01F 30/06 363/16 |
| 2004/0156162 A1 | 8/2004 | Nerheim | | |
| 2004/0190214 A1 * | 9/2004 | Dommer | ............. | F41H 13/0068 361/128 |
| 2006/0158122 A1 * | 7/2006 | Staines | ................... | H03B 1/02 315/39 |
| 2007/0085618 A1 * | 4/2007 | Ganghofer | ............. | H01Q 3/267 331/169 |
| 2008/0036549 A1 * | 2/2008 | Stark | ..................... | H03B 11/02 331/127 |
| 2008/0191559 A1 * | 8/2008 | Staines | ................. | H03B 11/02 307/108 |
| 2009/0015159 A1 * | 1/2009 | Urban | .................... | H03B 11/02 313/567 |
| 2009/0315406 A1 * | 12/2009 | Staines | .................. | H01J 25/74 307/109 |
| 2010/0001644 A1 * | 1/2010 | Stark | ..................... | H03B 11/02 315/39 |
| 2011/0040176 A1 * | 2/2011 | Razansky | ............ | A61B 5/0095 600/425 |
| 2011/0088802 A1 * | 4/2011 | Bryden | ................. | C02F 1/4608 137/803 |
| 2011/0283886 A1 * | 11/2011 | Ladha | ................ | B01D 46/0068 95/278 |

(Continued)

FOREIGN PATENT DOCUMENTS

DE  102005002279 A1  7/2006
DE  102006002652 A1  8/2007

(Continued)

*Primary Examiner* — Douglas W Owens
*Assistant Examiner* — Srinivas Sathiraju
(74) *Attorney, Agent, or Firm* — Laurence A. Greenberg; Werner H. Stemer; Ralph E. Locher

(57) ABSTRACT

A device for generating microwaves has a plurality of separately controlled microwave generators. Each of the generators includes a resonator, each with a capacitor structure formed with two electrodes that are separated by a spark gap. A high voltage supply charges the individual capacitor structures, which can be discharged by a breakdown of the spark gap. The individual capacitor structures are charged up by way of the high voltage supply device to a voltage that lies below the breakdown voltage of the individual spark gaps. A triggering device for triggering a breakdown of the respective spark gap is associated with each spark gap and the triggering devices are individually controlled by a common control device.

9 Claims, 4 Drawing Sheets

(56) References Cited

U.S. PATENT DOCUMENTS

| | | |
|---|---|---|
| 2012/0001498 A1 | 1/2012 | Mayes |
| 2012/0091097 A1* | 4/2012 | Chen .................. H01J 37/32926 216/59 |
| 2012/0098607 A1* | 4/2012 | Tatoian ............... F41H 13/0068 331/96 |
| 2013/0067725 A1* | 3/2013 | Behnke, II ......... A61B 18/1815 29/592.1 |
| 2013/0140985 A1* | 6/2013 | Dommer ................. H01J 23/36 315/39.61 |
| 2014/0191654 A1* | 7/2014 | Tantawi ................. H05H 9/044 315/5.41 |
| 2014/0285086 A1* | 9/2014 | Stark ..................... H01J 23/213 315/35 |
| 2014/0306603 A1* | 10/2014 | Bachman .............. H01J 65/044 315/35 |

FOREIGN PATENT DOCUMENTS

| | | |
|---|---|---|
| EP | 1777810 A2 | 4/2007 |
| EP | 1974464 A1 | 10/2008 |
| WO | 2007082687 A1 | 7/2007 |

* cited by examiner

DEVICE FOR GENERATING MICROWAVES

CROSS-REFERENCE TO RELATED APPLICATION

This application claims the priority, under 35 U.S.C. §119, of German patent application DE 10 2013 005 095.2, filed Mar. 23, 2013; the prior application is herewith incorporated by reference in its entirety.

BACKGROUND OF THE INVENTION

Field of the Invention

The invention relates to a device for generating microwaves. The device includes a plurality of separately controllable microwave generators, each comprising a resonator, each having a capacitor structure with two electrodes separated by a spark gap, as well as a high voltage supply means associated with the microwave generators for charging up the individual capacitor structures. Each capacitor structure can be discharged by a breakdown of the respective spark gap.

The function of such a microwave generator is based on a high voltage supply, i.e. a suitably configured high voltage source, such as, for example, a battery of capacitors parallel charged according to the principle of the Marx impulse voltage circuit and then connected in series, short circuited across a spark gap and thereby discharged. The spark gap is part of a capacitor structure, which is formed in the resonator, normally in a so-called DS resonator (DS=damped sinusoid). By means thereof the two electrodes forming the capacitor structure are isolated and the discharge takes place across the spark gap. The capacitance forms a resonant circuit with the physical properties of the switch plasma in the spark gap and in combination with the electrical wiring, the resonant circuit thereby consists of an ohmic resistance R, an inductance L and a capacitance C. The capacitance is charged up via a charging impedance to voltages up to in the 100 kV to the MV range. With increasing charge voltage, breakdown finally occurs according to Paschen's law.

As a result of the breakdown, or rather short circuit, strongly oscillating discharge currents or short circuit currents with steep edges occur in the resonator. The contain a mixture of very high frequencies, which are generally radiated via an antenna as microwave energy with a broadband spectrum dependent on the frequency mixture. The broadband microwave spectrum comprises a high energy density such that the radio traffic in the surroundings of such a microwave generator is at least impaired and input circuits of electronic circuits can be disrupted or even destroyed because of the resonance effects. A microwave generator of that type is described, for example, in commonly assigned U.S. Pat. No. 7,215,083 B2 and its counterpart German published patent application DE 10 005 002 279 A1. The configuration of the resonator provided therein comprises an outer pot-shaped electrode, in which an inner, correspondingly complementary shaped pole electrode is inserted, to which the antenna part is connected. The basic structure of such a microwave generator is known.

Occasionally it is desired, depending on the given situation or rather on any objects to be affected by the microwave pulse, to implement so-called "beam steering" or "beam forming." For this purpose a plurality of microwave generators are used, each comprising a resonator, normally a DS resonator, and each separately configured to output an HPEM pulse, i.e. a high energy microwave pulse. It is now sought to fire the individual microwave generators in a defined time sequence, so that the separately output HPEM pulses are generated in a defined phase relationship to each other and are superimposed in the desired manner, or rather beam shaping or beam focusing occurs by reflection of the pulses. This means that a defined phase relationship of the radiated wave fronts to each other should be set up or achieved by way of skilful time synchronization such that a defined desired pulse shape results due to the superimposition or reflection effects, etc.

However, even when setting the exact phase relationship of the individual radiated wave fronts to each other that is required for this, time synchronization of the generation of the individual HPEM pulses is thus only possible with great inaccuracy. With known microwave generators ignition takes place when, according to Paschen's law, a sufficiently high charge voltage is present at the capacitor structures, so that the ignition voltage is reached or rather is exceeded and a short circuit occurs across the spark gap. The actually required ignition voltage is, however, dependent on various parameters.

Directly according to Paschen's law it depends on the pressure of the insulating gas that is present within the generator, or rather the DS resonator, and on the nature of the insulating gas. This is usually $SF_6$. Furthermore, the ignition voltage depends on the electrode separation and the electrode geometry or rather the spark gap geometry, also on the surface quality of the electrodes, especially in the spark gap area, and the cleanliness of the entire system. This ultimately results in fluctuations of the ignition voltage in the range up to 20% in relation to the "theoretical" ignition voltage, i.e. that the exact breakdown ultimately cannot be defined or rather adjusted with high accuracy. In order to achieve a basic phase relationship, it is sought to adjust the same by way of different cable transition times between the high voltage supply means and the DS resonators. Active control is, however, not possible in that case.

It is also sought to achieve suitable temporally exact control of the phase relationship by triggering the high voltage supply means that is e.g. the individual Marx generators. Because of the high degree of inaccuracy of the point in time of ignition of the individual generators resulting from the jitter of the spark gaps and the additive behavior of the jitter values of the individual ignition generators as well as of the resonators within the entire system, sufficiently high time resolution of the switching processes cannot be achieved by this means and hence temporally exact control of the phases of the wave fronts cannot be achieved. "Beam steering" or "beam forming" by controlled superimposition of individual HPEM pulses is hence not possible.

SUMMARY OF THE INVENTION

It is accordingly an object of the invention to provide a microwave generator, which overcomes the above-mentioned disadvantages of the heretofore-known devices and methods of this general type and which is capable of igniting the individual generators with exact temporal resolution in order to enable suitable beam forming.

With the foregoing and other objects in view there is provided, in accordance with the invention, a device for generating microwaves, comprising:

a plurality of separately controllable microwave generators;

each of said generators having a resonator with a capacitor structure formed with two electrodes that are separated by a spark gap, wherein said capacitor structure is discharged by way of a breakdown of said spark gap;

a high voltage supply connected to charge each of said capacitor structures up to a given voltage below a breakdown voltage of the individual said spark gaps; and a triggering device associated with each spark gap for triggering a breakdown of the respective said spark gap, and a common control device for individually controlling each of said triggering devices.

In other words, the objects are achieved in accordance with the invention, in that the individual capacitor structures can be charged up by way of the high voltage supply means to a voltage below the breakdown voltage of the individual spark gaps, and that a triggering device for triggering a breakdown of the respective spark gap is associated with each spark gap, wherein the triggering devices can be individually controlled by way of a common control device.

Individual triggering of the individual resonators, each having a separate associated triggering device, takes place with the device according to the invention. By means of the common control device, each triggering device can be individually controlled so that as a consequence exact temporal synchronization of the individual ignition points in time of the individual generators can be achieved by means of the control device. The high voltage supply means external to the generator, that is e.g. the single Marx generator or the plurality of Marx generators, is used for charging up the capacitor structure to a voltage sufficiently below the ignition voltage so that this alone does not cause discharging. Discharging only takes place if the respective spark gap is ignited by means of the triggering device, thus the short circuit is initiated hereby in a controlled manner. This means that according to the invention specific generator-related triggering is specified within the respective HPEM-DS resonators within the entire system as an integrated pulse-forming network. By means of said triggering within the individual resonators, all statistical effects are advantageously eliminated, which in the previous application of un triggered DS resonators together with an un triggered or triggered high voltage generator, such as e.g. the Marx generator, accumulate and act negatively on the delay, the jitter and the amplitude statistics of the output pulses. This is because the individual triggered DS resonators enable the temporal statistical fluctuations caused by the jitter of the Marx generator to be completely eliminated with particular advantage, and consequently the ignition behavior of the resonator to be separated from the behaviour of the high voltage generator. At the same time the triggered resonator enables the statistical effects in the amplitude fluctuation of the output pulse at the resonator to be significantly reduced and the same to be monitored and adjusted reproducibly. It is also possible to operate or rather to ignite the resonator below its self-breakdown characteristic and hence also to vary the amplitude of the output pulse almost independently of the breakdown voltage of the spark gap in the resonator. This is because the ignition can take place by means of the triggering device substantially independently of the charging voltage ultimately applied by the high voltage generator.

Thus the device according to the invention enables temporally highly accurate synchronization of the individual generators and thus of the individual generated wave fronts, so that these can be superimposed in a desired manner to form a total pulse and consequently active beam forming or rather beam focusing is possible. This is because it is only the jitter of the individual resonators that is significant for the synchronization or rather phase control of the wave fronts. In addition, direct triggering of the resonator results in a significant improvement of the ignition behavior and hence in a reduction of the temporal jitter of the individual resonators, so that as a result only the temporal triggering of the individual resonators relative to each other has to be compensated in order to achieve a suitable phase relationship.

A common high voltage supply means, that is e.g. a common Marx generator, can be associated with the microwave generators. Alternatively, a dedicated high voltage supply means can be associated with each individual microwave generator, i.e. the charging up of each resonator takes place e.g. by means of a dedicated Marx generator, so that consequently besides an array of microwave generators an array of high voltage generators is ultimately also provided.

The high voltage supply means, no matter what type it is, charges the capacitor structures preferably up to the maximum of approx. 90%, especially only to a maximum of approx. 80% of the resonator-specific breakdown voltage. The charge should lie sufficiently far below the theoretical breakdown voltage of the spark gap resulting from Paschen's law in order to be certain that no unintentional ignition occurs.

Applicable triggering devices can operate according to different methods. The technical design and the physical properties of the triggering device used are oriented mainly to the specific properties and requirements of the respective DS resonators. Besides the required high voltage insulation in the range of a few 100 kV and operation in a high pressure environment of a number of bar up to 100 bar, the triggering is to be implemented such that sufficient primary charge carriers are made available in order to ensure triggering with adequate rapidity and time resolution, but at the same time such that this boosts or at least does not impair the physical or electrical and electromagnetic properties (impedance, waveguide, antenna) of the resonator.

The triggering devices can be designed as electrically operating triggers, e.g. as overvoltage triggers, field distortion triggers, charge carrier injection triggers, electron beam triggers or as surface sliding spark triggers.

Alternatively, the triggering devices can also be designed as optically working triggers, e.g. in the form of laser triggers, x-ray triggers or UV or VUV radiation triggers. Combinations of differently working triggers are also basically conceivable within the resonator array.

Other features which are considered as characteristic for the invention are set forth in the appended claims.

Although the invention is illustrated and described herein as embodied in a device for generating microwaves, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
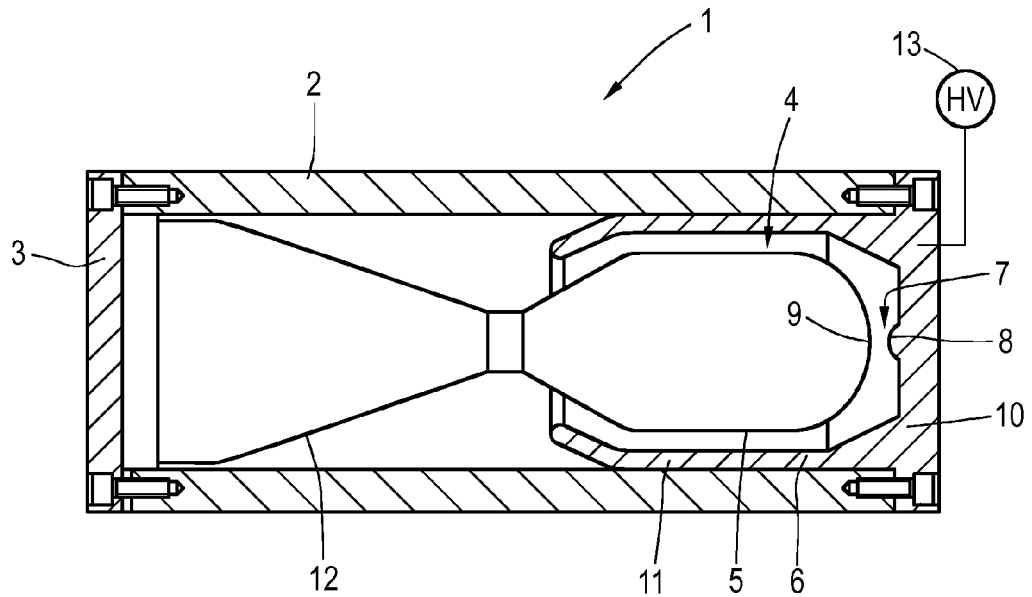
FIG. 1 shows an illustration of the principle of a microwave generator.

Referring now to the figures of the drawing in detail and first, particularly, to FIG. 1 thereof, there is seen a microwave generator 1 in the form of a representation of principle. It consists of a cylindrical insulating housing 2 formed, for example, of composite fiberglass material, which is closed on one side by a cover lid 3. The cover lid 3, which is an optional element in the context, is preferably also made of insulating material. Within the housing there is a resonator 4, consisting of two mutually opposing electrodes 5, 6, wherein the electrode 5, that is the inner electrode, is substantially made in a lobe shape with a central cylindrical section of constant diameter. It forms the inner electrode. By contrast, the outer electrode 6 is made in a pot shape. Both are rotation symmetrical components.

The two electrodes 5, 6 are separated from each other by a spark gap 7, said spark gap 7 being formed by two ignition electrodes 8, 9. By way of example here the one ignition electrode 8 is implemented as a protruding rounded elevation and is provided on the outer electrode 6. The ignition electrode 9 is provided as an integral area on the spherical cap of the inner electrode 5.

A gaseous dielectric, e.g. $SF_6$, is accommodated within the housing at high pressure. The usually employed pressure reach from at least a few bar up to generally a maximum of approximately 100 bar.

The outer electrode 6 comprises a pot shape as described. It consists of a bottom section 10 on which is provided an axially protruding hollow cylindrical electrode section 11 that encloses the lobe-shaped resonator or rather the electrode 5, on which an antenna 12 is provided as a radiating element in the form of a hopper-like structure. The electrode section 11 also has a constant diameter in the central area, where it encloses the cylindrical central section of the electrode 5. Termination of the housing on this side takes place by means of the bottom section 10 of the electrode 6. The electrode 6 is preferably implemented as a one-piece metallic component and the electrode 5 is implemented as a hollow metallic component.

As FIG. 1 shows, both electrodes 5, 6 are implemented essentially cylindrically in the respective central areas, their shapes are thus adapted to each other and the separation is constant in said area. The basic design of the electrodes, especially in said area, as regards a constant spacing should be such that essentially constant impedance behavior results. In the end region both the inner electrode 5 and also the outer electrode 6 taper, wherein they reduce in diameter but the distance between the two increases, see FIG. 1. This results in targeted impedance matching, an impedance step being achieved at which part of the oscillating current is reflected. The form and the duration of the radiated HPEM pulses can be correspondingly adapted by means of the specific, geometry-related impedance shape or the impedance profile.

Because the bottom section 10 of the electrode 6 forms the end of the housing at the same time, a high voltage supply means, i.e. a high voltage source 13, e.g. a Marx impulse voltage generator, can be connected here in a simple manner. The capacitor structure on the resonator side, which is formed by the two electrodes 5, 6, is charged up by means of said high voltage source 13 (the inner electrode 5 is preferably connected to earth for this purpose; not shown graphically in FIG. 1), until according to the invention a controlled discharge initiated by direct triggering of the resonator 4 takes place by means of a short circuit, so that discharge or short-circuit currents occur, which perform oscillating vibrations on the electrode 5.

Figure 2:
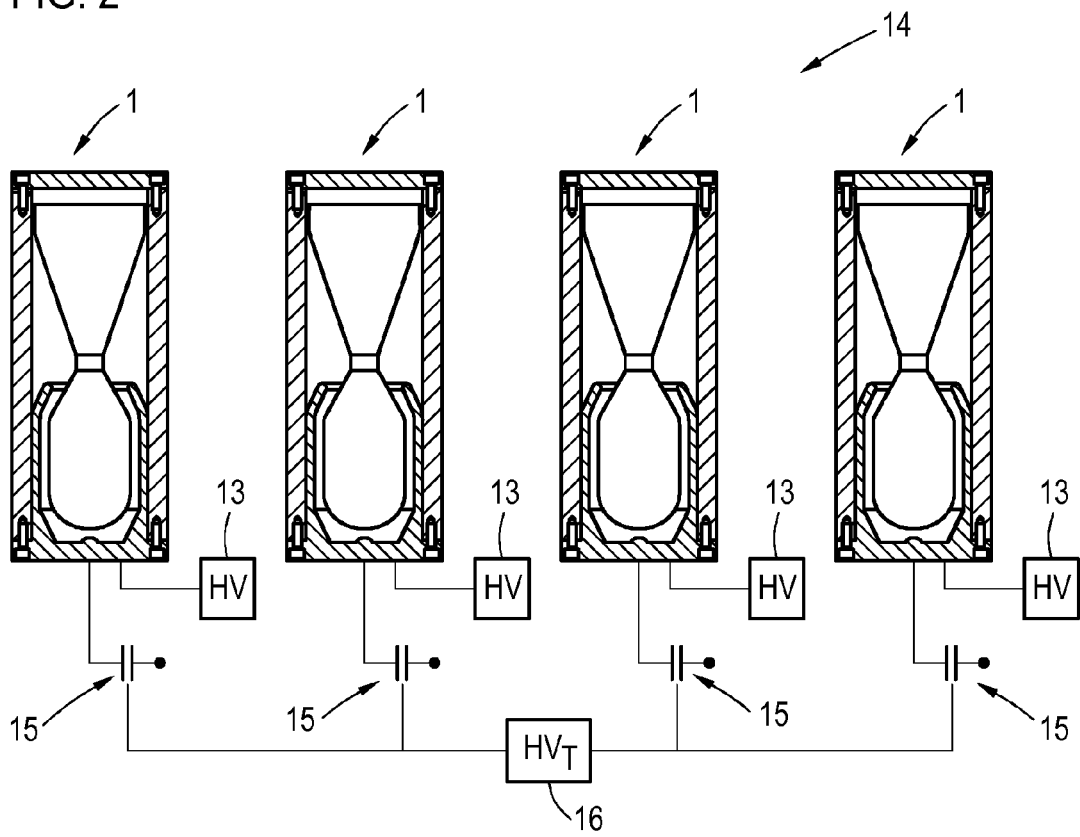
FIG. 2 shows an illustration of the principle of the device according to the invention.

FIG. 2 shows a device 14 according to the invention, comprising by way of example four microwave generators 1. These may be of the type described above with reference to FIG. 1. This means that regarding the structure reference is made to the explanations for FIG. 1. A dedicated high voltage source 13 for charging up the respective capacitor structures is associated with each microwave generator 1.

Figure 3:
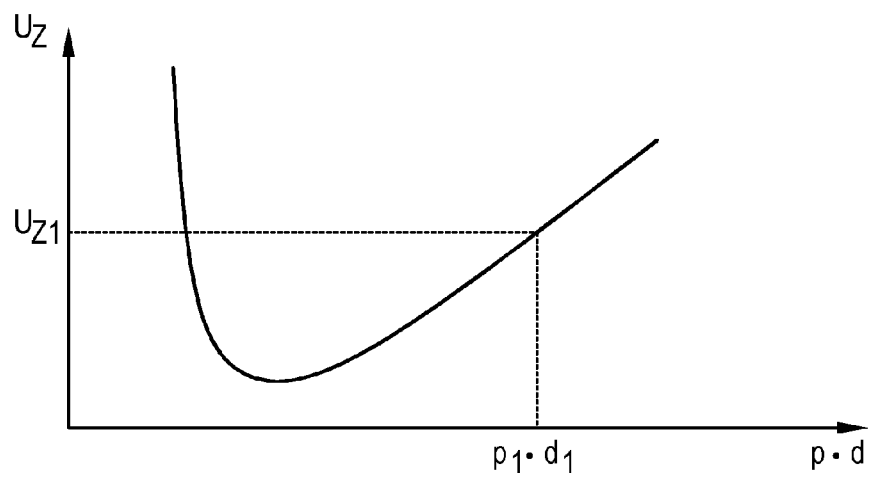
FIG. 3 shows a diagram of the principle for representation of the Paschen curve.

With known microwave generators, charging would take place by way of the high voltage source 13 until the voltage across the spark gap 7 reaches the breakdown voltage. The breakdown voltage, also known as the ignition voltage, depends inter alia on the specified internal pressure as well as on the separation of the ignition electrodes 8, 9. This results from Paschen's law, the corresponding curve being shown in FIG. 3 by way of example.

There the product of the pressure p and the electrode separation d is plotted along the abscissa and the ignition voltage $U_Z$ is plotted along the ordinate. The left, falling branch of the curve describes generators that operate with low pressure, the right branch of the curve describing the case of generators shown here that operate with high overpressure, usually in the range from 10 to 100 bar. Clearly, a certain ignition voltage is associated with each product p·d, by way of example here the ignition voltage $U_{Z1}$ is shown for product $p_1 \cdot d_1$. If, as previously usual, the respective capacitor structure is charged up to $U_{Z1}$ by way of the respective high voltage source 13 with ignition of the high voltage source 13, then breakdown of the spark gap 7 occurs no later than when reaching $U_{Z1}$ and hence a current flow and radiation of an HPEM pulse occur.

However, the operation of the device 14 according to the invention is different. Here the individual capacitor structures of the individual microwave generators 1 are only charged up to a voltage that lies below the resonator-specific ignition voltage resulting from Paschen's law by means of the respective high voltage source 13 (alternatively all microwave generators 1 could also be associated with a common high voltage source 13 that charges them up), wherein for safety reasons the charging voltage lies below the discharge voltage by at least 10%, preferably by at least 20%. This means that self-breakdown of the respective spark gaps and hence pulse generations do not occur as a result of the base charging voltage alone.

For actual ignition each microwave generator 1 comprises a triggering device 15, by way of which each resonator can be individually triggered, consequently therefore the breakdown of each spark gap can be individually controlled and effected. For this purpose a common control device 16 is provided, which controls all triggering devices 15 incorporated within the system synchronized according to a specified time schema, so that consequently a highly accurate triggering time sequence can be set up or rather carried out and consequently the individual HPEM pulses of the individual generators 1 are generated exactly synchronized, so that they can be superimposed according to a desired pattern and specific beam forming, resulting from superimposition or reflection effects etc., can be achieved. This is possible because during adjustment or rather control of the individual triggering devices 15 or rather microwave generators 1 only a slight amount of jitter on the part of the spark gaps has to be taken into account, but not any time-critical properties of the high voltage source 13, which have a high degree of jitter when they are to ignite in order to generate a high voltage pulse according to the prior art to break down the spark gap, which ultimately makes it almost impossible to achieve temporally exact synchronization. This means that only the jitter of the respective DS resonator is significant for synchronization or phase control of the wave fronts or the individual pulses output by the generators 1.

FIGS. 4 to 13 show different designs of possible triggering devices 15, which operate with different methods depending on the design.

Figure 4:
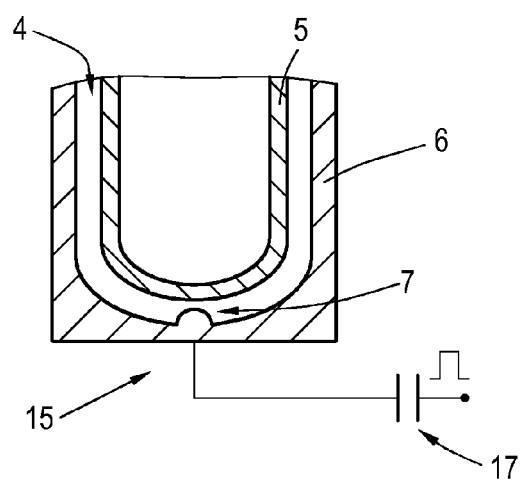
FIGS. 4-13 are diagrammatic sections through different embodiments of triggering devices that can be used.

FIG. 4 shows by way of example a triggering device 15 that is designed as a simple overvoltage trigger. Each overvoltage trigger 15 quite fundamentally comprises a high voltage source 17 generating the required triggering voltage, which is shown here with the illustrated capacitor structure by way of example. Discharging said high voltage source 17 is controlled by means of the control device 16.

As described, the respective high voltage source 13 charges the respective capacitor structure on the resonator side only up to a voltage significantly below the spark gap-specific ignition voltage $U_z$. The ignition voltage still required in order to effect breakdown across the spark gap is now provided by means of the triggering device 15, said ignition voltage being e.g. of a similar order of magnitude to the charging voltage applied by means of the high voltage source 13. Once the triggering voltage is applied by means of the triggering device 15, there is finally in total a sufficiently high total voltage at the spark gap 7, so that breakdown occurs immediately, the capacitor structure suddenly discharges and the microwave pulse is generated.

Figure 5:
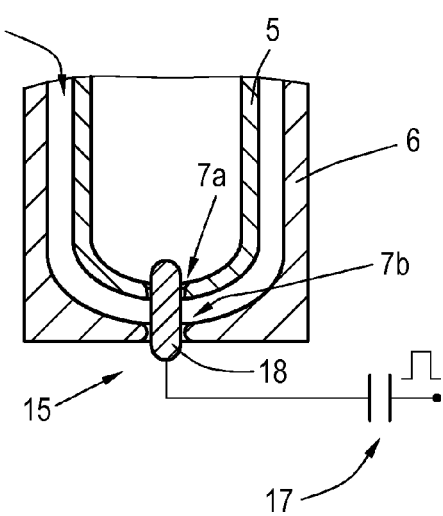
Figure 6:
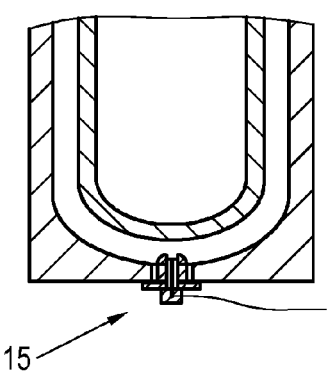

FIG. 5 shows a different design of a triggering device 15. The triggering device 15 in FIG. 5 is designed as a field distortion trigger. It again comprises a high voltage source 17 that provides the triggering voltage. In that case, however, an additional electrode 18 is provided on the resonator side that passes respectively through an aperture in the inner electrode 5 and in the outer electrode 6, wherein two spark gaps 7a, 7b are formed in this area because the electrode 18 is at a distance from the two other electrodes 5, 6. On applying the triggering voltage in addition to the voltage already applied by means of the high voltage source 13, breakdown consequently occurs in the individual spark gaps 7a, 7b, so that here too discharging takes place, but by means of the central electrode 18. Here too the necessary triggering voltage is at least in the region of the charging voltage regarding its order of magnitude.

FIGS. 6 to 9 show different embodiments of a triggering device 15 in the form of a plasma injection trigger. As in the enlarged illustrations according to FIGS. 7 to 9, each of which shows a plasma injection trigger, each such triggering device comprises an electrode 19 that is fed into an insulator 20 in the region of the spark gap 7. The end of the electrode lies within an ignition electrode 8 that is annular in this case and that is part of the outer electrode 6. An albeit relatively low high voltage in the range of a few kV is now applied by means of the ignition high voltage source 17 also provided here by controlling the same by means of the common control device 16. This initially results in the formation of a local plasma between electrode 19 and electrode 8. Because the separation that the insulator 20 defines is relatively small, being typically in the region of a few 100 μm, as a consequence only small voltages—compared to the charging voltage—are necessary to form the plasma between said two electrodes 8 and 19. Once a plasma cloud is formed in said area, as a consequence charge carrier injection takes place and the plasma propagates in the spark gap in an avalanche manner so that a reliable and definite breakdown occurs.

Figure 7:
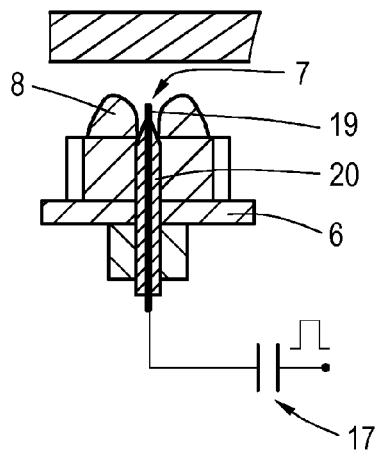
Figure 8:
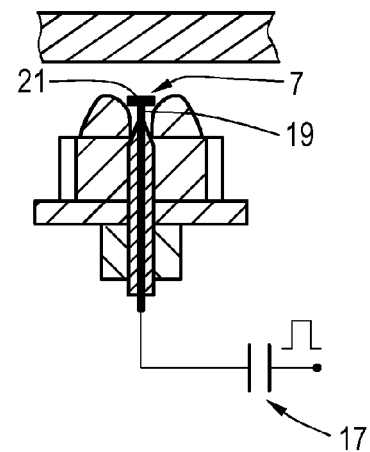
Figure 9:
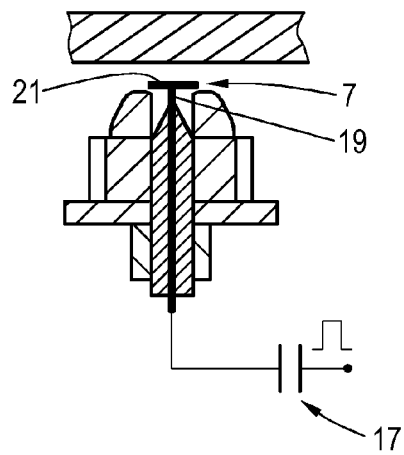

FIGS. 7 to 9 show as described different designs of the trigger, wherein in each case the form of the electrode changes therein. Whereas in FIG. 7 a simple rod-shaped or pin-shaped electrode 19 is provided, the electrode 19 according to FIG. 8 comprises a terminal plate 21, which is designed to be still larger for the electrode 19 of FIG. 9 and in each case is used to protect the insulator.

Figure 10:
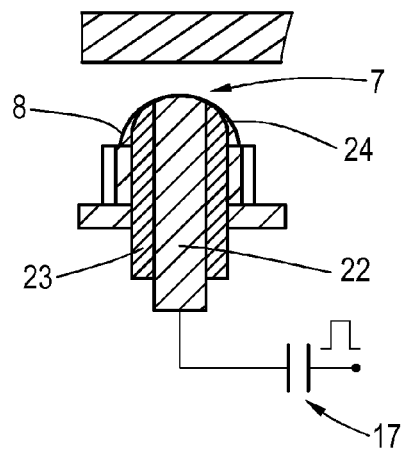
Figure 11:
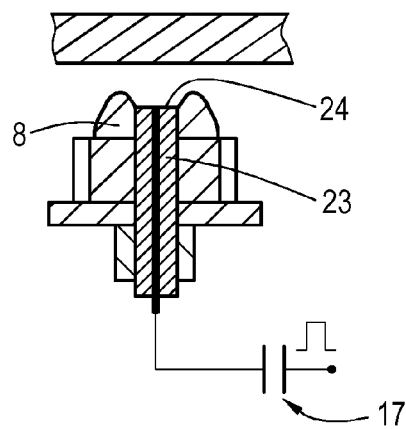

FIGS. 10 and 11 show two configurations of triggering devices 15, which are designed as surface sliding spark triggers. An electrode 22 is again provided that is accommodated in an insulator 23. The electrode 22 ends quasi flush with the insulator 23, which for its part contacts the ignition electrode 8 directly with its outer surface 24. If a voltage in the range of a few kV is now again applied to the electrode 22 here by means of the ignition voltage source or high voltage source 17, then charge carriers migrate across the insulator surface 24 to the electrode 8 and a first plasma cloud is formed on the surface and extends into the spark gap 7 so that ignition takes place.

FIG. 11 shows a design based on the same operating principle, wherein, however, a different configuration of the electrode 22 and of the insulator 23 and of the ignition electrode 8 is provided here, the principle of operation being the same, however.

The ignition of said trigger is simplified by one or a plurality of tracks already being burned on the surface 24 of the insulator following a first ignition process, which consequently form more conductive channels and facilitate the formation of the initial plasma.

Figure 12:
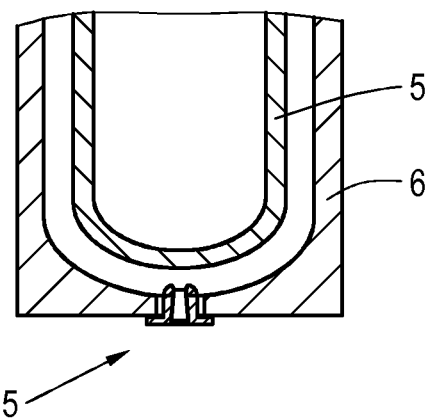
Figure 13:
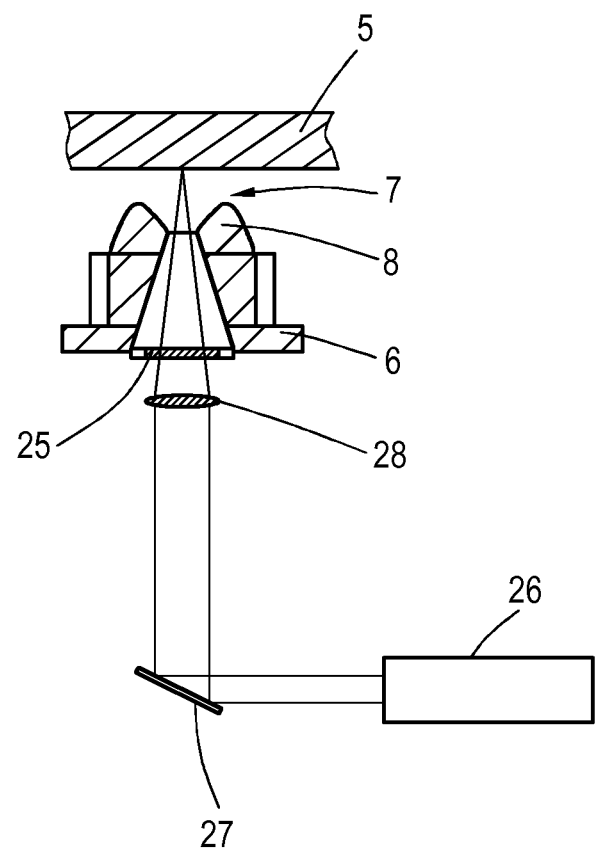

Finally, FIGS. 12 and 13 show a configuration of a triggering device 15 in the form of an optical trigger. In that case a window 25 is inserted in the outer electrode 6 with a lens 28 disposed in front thereof. The window 25 is disposed centrally symmetrically relative to the ignition electrode 8, which is also designed as a ring here. By means of a radiation source 26, in this case e.g. a laser, high energy light is introduced by means of a deflection mirror 27 via the lens 28 and the window 25 into the region of the spark gap 7, resulting in generation of the plasma and hence in ignition. For example, it is possible to focus the beam on the surface of the inner electrode 5 so that a thermal plasma forms on the surface there that causes ignition. It is also conceivable, however, to focus the beam in the volume of the spark gap 7, so that this results in an induced partial breakthrough from the volume.

The designs shown of the various triggering devices 15 are only exemplary, clearly other differently constructed triggering devices also being conceivable insofar as regarding the geometry of the components and the principle of operation used. It is common to all designs, however, that by way of the triggering devices selectively and individually triggering takes place directly within the spark gap, which then causes actual breakdown and hence the generation of the HPEM pulse.

The invention claimed is:
1. A device for generating microwaves, comprising:
a plurality of separately controllable microwave generators;
each of said generators having a resonator with a capacitor structure formed with two electrodes that are separated by a spark gap, wherein said capacitor structure is discharged by way of a breakdown of said spark gap;

a high voltage supply connected to charge each of said capacitor structures up to a given voltage below a breakdown voltage of the individual said spark gaps;

a triggering device associated with each spark gap for triggering a breakdown of the respective said spark gap; and a common control device for individually controlling each of said triggering devices and for controlling all triggering devices synchronized according to a specified time schema.

2. The device according to claim 1, wherein said high voltage supply is a common high voltage supply device associated with said microwave generators.

3. The device according to claim 1, wherein said high voltage supply is a plurality of dedicated high voltage supply devices each associated with a respective said microwave generator.

4. The device according to claim 1, wherein said high voltage supply is configured to charge each of said capacitor structures to a maximum of 90% of a resonator-specific breakdown voltage.

5. The device according to claim 4, wherein said high voltage supply is configured to charge each of said capacitor structures to a maximum of 80% of the resonator-specific breakdown voltage.

6. The device according to claim 1, wherein said triggering devices are electrically operating triggers.

7. The device according to claim 6, wherein said electrically operating triggers are selected from the group consisting of overvoltage triggers, field distortion triggers, charge carrier injection triggers, electron beam triggers, and surface sliding spark triggers.

8. The device according to claim 1, wherein said triggering devices are optically operating triggers.

9. The device according to claim 8, wherein said optically operating triggers are selected from the group consisting of laser triggers, x-ray triggers, UV radiation triggers, and VUV radiation triggers.

\* \* \* \* \*